United States Patent
Cheng et al.

(10) Patent No.: US 9,761,693 B2
(45) Date of Patent: Sep. 12, 2017

(54) METHOD FOR FABRICATING SEMICONDUCTOR DEVICE

(71) Applicant: UNITED MICROELECTRONICS CORP., Hsin-Chu (TW)

(72) Inventors: Yin-Cheng Cheng, Taichung (TW); Po-Lun Cheng, Kaohsiung (TW); Ming-Chih Hsu, Tainan (TW); Ya-Chen Chang, Taichung (TW); Hsien-Yao Chu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/339,942

(22) Filed: Nov. 1, 2016

(65) Prior Publication Data

US 2017/0047427 A1    Feb. 16, 2017

Related U.S. Application Data

(63) Continuation-in-part of application No. 14/555,597, filed on Nov. 27, 2014, now abandoned.

(51) Int. Cl.
| | |
|---|---|
| *H01L 21/336* | (2006.01) |
| *H01L 29/66* | (2006.01) |
| *H01L 21/02* | (2006.01) |
| *H01L 29/165* | (2006.01) |
| *H01L 29/78* | (2006.01) |
| *H01L 29/08* | (2006.01) |
| *H01L 29/161* | (2006.01) |

(52) U.S. Cl.
CPC .. *H01L 29/66636* (2013.01); *H01L 21/02532* (2013.01); *H01L 29/0847* (2013.01); *H01L 29/161* (2013.01); *H01L 29/165* (2013.01); *H01L 29/7834* (2013.01); *H01L 29/7848* (2013.01); *H01L 29/6656* (2013.01)

(58) Field of Classification Search
CPC ........... H01L 29/66636; H01L 29/7834; H01L 29/66628; H01L 29/7848; H01L 21/0253; H01L 21/02576; H01L 21/0262; H01L 21/02639
USPC ....................................... 438/300
See application file for complete search history.

(56) References Cited

U.S. PATENT DOCUMENTS

| | | |
|---|---|---|
| 6,326,664 B1 | 12/2001 | Chau |
| 7,579,248 B2 | 8/2009 | Huang et al. |
| 8,809,170 B2 | 8/2014 | Bauer |
| 8,828,850 B2 | 9/2014 | Cheng |
| 8,853,060 B1 | 10/2014 | Lai |
| 2007/0161216 A1 | 7/2007 | Bauer |
| 2007/0287272 A1 | 12/2007 | Bauer et al. |
| 2014/0117456 A1 | 5/2014 | Huang |
| 2014/0197493 A1 | 7/2014 | Tsai et al. |

(Continued)

*Primary Examiner* — Trung Q Dang
(74) *Attorney, Agent, or Firm* — Winston Hsu

(57) ABSTRACT

A method for fabricating semiconductor device is disclosed. First, a substrate is provided, a gate structure is formed on the substrate, a spacer is formed around the gate structure, and an epitaxial layer is formed in the substrate adjacent to the spacer. Preferably, the step of forming the epitaxial layer further includes: forming a buffer layer in the substrate; forming a bulk layer on the buffer layer; forming a linear gradient cap on the bulk layer, and forming a silicon cap on the linear gradient cap. Preferably, the etching to deposition ratio of the linear gradient cap is greater than 50% and less than 100%.

10 Claims, 1 Drawing Sheet

(56) References Cited

U.S. PATENT DOCUMENTS

| | | | |
|---|---|---|---|
| 2014/0264636 A1 | 9/2014 | Tsai | |
| 2015/0236157 A1* | 8/2015 | Kwok | H01L 29/7848 257/192 |
| 2016/0013316 A1* | 1/2016 | Kuang | H01L 21/0243 257/190 |

* cited by examiner

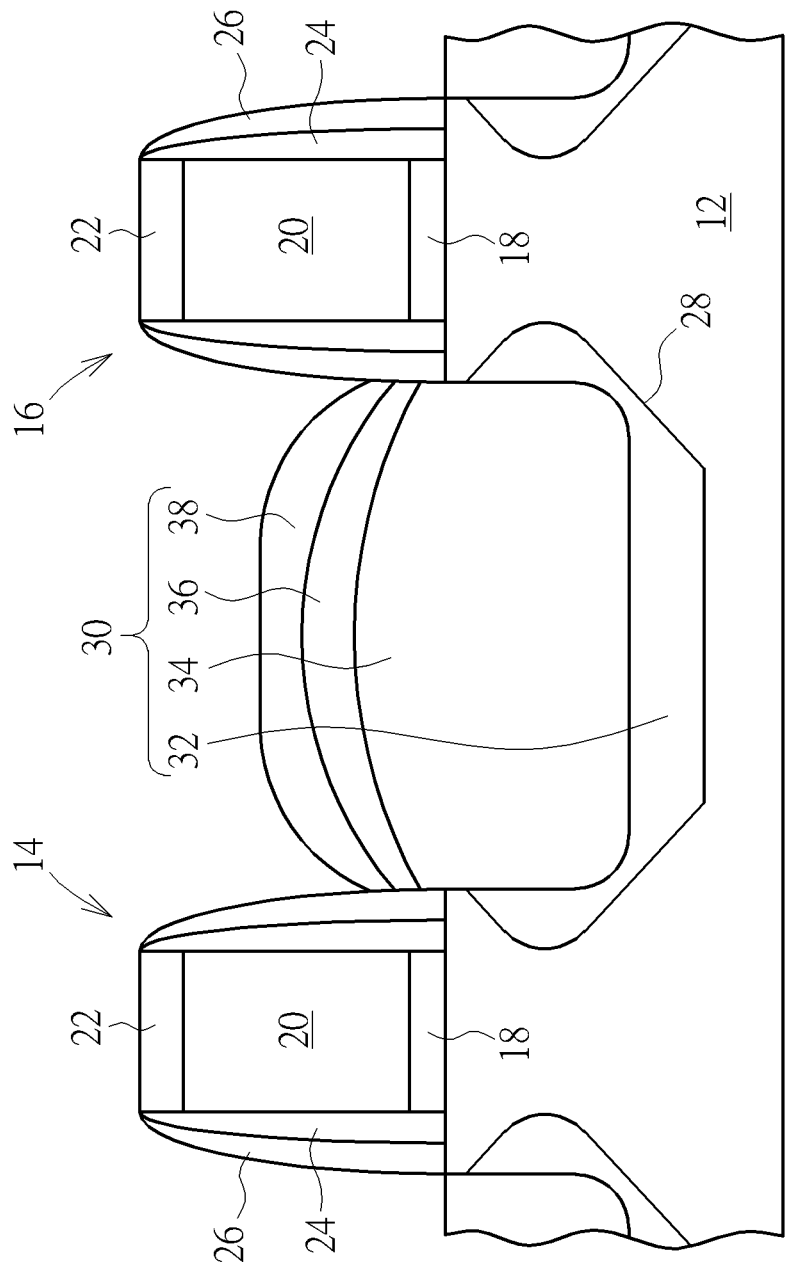

METHOD FOR FABRICATING SEMICONDUCTOR DEVICE

CROSS REFERENCE TO RELATED APPLICATIONS

This application is a continuation-in-part of U.S. application Ser. No. 14/555,597, filed on Nov. 27, 2014, and is incorporated herein by reference.

BACKGROUND OF THE INVENTION

1. Field of the Invention

The invention relates to a method for fabricating semiconductor device, and more particularly, to a method of adjusting etching to deposition ratio of epitaxial layer for lowering defect.

2. Description of the Prior Art

Reduction of the size and the inherent features of semiconductor devices (e.g., a metal-oxide semiconductor field-effect transistor) has enabled continued improvement in speed, performance, density, and cost per unit function of integrated circuits over the past few decades. In accordance with a design of the transistor and one of the inherent characteristics thereof, modulating the length of a channel region underlying a gate between a source and drain of the transistor alters a resistance associated with the channel region, thereby affecting performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

To further enhance the performance of MOS devices, stress may be introduced in the channel region of a MOS transistor to improve carrier mobility. Generally, it is desirable to induce a tensile stress in the channel region of an n-type metal-oxide-semiconductor ("NMOS") device in a source-to-drain direction, and to induce a compressive stress in the channel region of a p-type metal-oxide-semiconductor ("PMOS") device in a source-to-drain direction.

A commonly used method for applying compressive stress to the channel regions of PMOS devices is growing epitaxial layer such as SiGe stressors in the source and drain regions. Such a method typically includes the steps of forming agate stack on a semiconductor substrate, forming spacers on sidewalls of the gate stack, forming recesses in the silicon substrate along gate spacers, epitaxially growing SiGe stressors in the recesses and annealing. Since SiGe has a greater lattice constant than silicon, it expands after annealing and applies a compressive stress to the channel region, which is located between a source SiGe stressor and a drain SiGe stressor.

The above-discussed method, however, has found to include numerous defects especially after the formation of epitaxial layer. Hence, how to adjust the current fabrication flow for resolving this issue has become an important task in this field.

SUMMARY OF THE INVENTION

According to a preferred embodiment of the present invention, a method for fabricating semiconductor device is disclosed. First, a substrate is provided, a gate structure is formed on the substrate, a spacer is formed around the gate structure, and an epitaxial layer is formed in the substrate adjacent to the spacer. Preferably, the step of forming the epitaxial layer further includes: forming a buffer layer in the substrate; forming a bulk layer on the buffer layer; forming a linear gradient cap on the bulk layer, and forming a silicon cap on the linear gradient cap. Preferably, the etching to deposition ratio of the linear gradient cap is greater than 50% and less than 100%.

According to another aspect of the present invention, a method for fabricating semiconductor device is disclosed. First, a substrate is provided, a gate structure is formed on the substrate, a spacer is formed around the gate structure, and an epitaxial layer is formed in the substrate adjacent to the spacer. Preferably, the step of forming the epitaxial layer includes: forming a buffer layer in the substrate; forming a bulk layer on the buffer layer; forming a linear gradient cap on the bulk layer; and forming a silicon cap on the linear gradient cap. Preferably, the etching to deposition ratio of the silicon cap is greater than 50% and less than 100%.

These and other objectives of the present invention will no doubt become obvious to those of ordinary skill in the art after reading the following detailed description of the preferred embodiment that is illustrated in the various FIGURES and drawings.

BRIEF DESCRIPTION OF THE DRAWINGS

FIGURE illustrates a method for fabricating semiconductor device according to a preferred embodiment of the present invention.

DETAILED DESCRIPTION

Referring to the FIGURE, the FIGURE illustrates a method for fabricating semiconductor device according to a preferred embodiment of the present invention. As shown in the FIGURE, a substrate 12, such as a silicon substrate or silicon-on-insulator (SOI) substrate is provided, and a plurality of shallow trench isolations (STIs) (not shown) could be formed in the substrate 12. It should be noted that since a planar MOS transistor were to be fabricated in this embodiment, no fin-shaped structures are present in the substrate 12. However, if a non-planar transistor, such as a FinFET were to be fabricated, at least a fin-shaped structure (not shown) and STI surrounding the fin-shaped structure could be formed on the substrate 12.

The formation of the fin-shaped structure could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure. Alternatively, the formation of the fin-shaped structure could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure. In another fashion, the patterned hard mask could be removed selectively or retained, and deposition, CMP, and then etching back could be used to form a STI surrounding the bottom of the fin-shaped structure. Moreover, if the substrate 12 were a SOI substrate, a patterned mask could be used to etch a semiconductor layer on the substrate 12 until reaching a bottom oxide layer underneath the semiconductor layer to form the corresponding fin-shaped structure. If this means is chosen the aforementioned steps for fabricating the STI could be eliminated.

Gate structures 14 and 16 are then formed on the substrate 12 by first depositing an interfacial layer (not shown), a silicon layer (not shown), and a hard mask layer (not shown) on the substrate 12. A patterned transfer is conducted thereafter by forming a patterned mask, such as a patterned resist (not shown) on the hard mask layer, and a dry etching process is conducted by using the patterned resist to remove part of the hard mask layer, part of the silicon layer, and part of the interfacial layer for forming the gate structures 14 and 16. In other words, each of the gate structures 14 and 16 is preferably composed of a patterned interfacial layer 18, a patterned silicon layer 20, and a patterned hard mask 22.

In this embodiment, the interfacial layer 18 is preferably composed of silicon material such as silicon dioxide (SiO$_2$), silicon nitride (SiN), or silicon oxynitride (SiON), or other dielectric material with high permittivity or dielectric constant. The silicon layer 20 is preferably composed of single crystal silicon, doped polysilicon, or amorphous polysilicon, and the hard mask 22 is composed of silicon nitride. Despite the hard mask 22 of this embodiment is a single-layered structure, the hard mask 22 could also be a dual-layered structure selected from the group consisting of SiC, SiON, SiN, SiO, SiCN and SiBN, which is also within the scope of the present invention.

After forming the gate structure 14 and 16, offset spacer 24, lightly doped drain (LDD) (not shown), main spacer 26, and source/drain region (not shown) could be formed either on the sidewalls of the gate structures 14 and 16 or in the substrate 12. As the formation of these elements is well known to those skilled in the art, the details of which are not explained herein for the sake of brevity.

Next, a recess 28 is formed in the substrate 12 adjacent to the gate structures 14 and 16, and an epitaxial layer 30 is formed in the recess 28. The formation of the epitaxial layer 30 could be accomplished by sequentially depositing a buffer layer 32 in the recess 28, a bulk layer 34 on the buffer layer 32, a linear gradient cap 36 on the bulk layer 34, and a silicon cap 38 on the linear gradient cap 36. Preferably, the buffer layer 32, the bulk layer 34, and the linear gradient cap 36 are composed of epitaxial material of same conductive type depending on the device being fabricated while the silicon cap 38 is composed of pure silicon. For instance, if a PMOS transistor were to be fabricated, the buffer layer 32, bulk layer 34, and linear gradient cap 36 would be composed of p-type epitaxial material such as silicon germanium, whereas if a NMOS transistor were to be fabricated, the buffer layer 32, bulk layer 34, and linear gradient cap 36 would be composed of n-type epitaxial material such as silicon phosphorus.

According to a preferred embodiment of the present invention, the etching to deposition ratio used for forming the epitaxial layer 30 is greater than 50%. It should be noted that even though the etching to deposition ratio for forming all four layers of the epitaxial layer 30, such as the buffer layer 32, bulk layer 34, linear gradient cap 36, and silicon cap 38 could be controlled to be greater than 50%, it would also be desirable to control the etching to deposition ratio of at least one of the four layers 32, 34, 36, 38 from the epitaxial layer 30 to be greater than 50%. For instance, depending on the demand of the product, it would be desirable to control only the etching to deposition ratio of the buffer layer 32 to be greater than 50%, only the etching to deposition to deposition ratio of the bulk layer 34 to be greater than 50%, only the etching to deposition ratio of the linear gradient cap 36 to be greater than 50%, or only the etching to deposition ratio of the silicon cap 38 could be greater than 50%. Alternatively, it would also be desirable to control the etching to deposition ratio of two or more of the four layers 32, 34, 36, 38 from the epitaxial layer 30 to be greater than 50%, which is also within the scope of the present invention.

Specifically, the etching to deposition ratio (E/D ratio) of the epitaxial layer is calculated by the following formula:

$$E/D \text{ Ratio} = \frac{\text{Etching gas flow}}{0.01*\text{Dose flow} + \text{Silicon source flow} + \text{Ge source flow}}$$

Preferably, the etching gas flow refers to composition or combination of gases utilized in the etching process, in which a preferable etching gas used in this embodiment includes HCl, but not limited thereto. The dose flow refers to a dopant source utilized during the etching and deposition process, in which the dose flow is selected from the group consisting of boron, arsenic, phosphorus, gallium, and aluminum. The silicon source flow refers to a source of silicon injected during the etching and deposition process, in which the silicon source is selected from the group consisting of SiH$_4$, Cl$_2$SiH$_4$, and Cl$_3$SiH. Ge source flow refers to a concentration of germanium source injected during the formation of the epitaxial layer 30, in which a typical source of germanium includes GeH$_4$. It should be noted that even though germanium is utilized as the main source for forming the epitaxial layer 30 in this embodiment, it would also be desirable to use other dopant source for forming the epitaxial layer 30 depending on the type of device being fabricated.

After the epitaxial layer 30 is formed, elements including silicides, contact etch stop layer (CESL), interlayer dielectric (ILD) layer could be formed and if a metal gate transistor were to be fabricated, a replacement metal gate (RMG) process could be carried out to transform the gate structures 14 and 16 into metal gates. As the formation of these elements and the RMG process are well known to those skilled in the art, the details of which are not explained herein for the sake of brevity.

Overall, by using an etching to deposition ratio of greater than 50% to form the epitaxial layer, such as by controlling the etching to deposition ratio of at least one of the four layers 32, 34, 36, 38 from the epitaxial layer 30 to be greater than 50%, defects typically found in NMOS and PMOS region could be minimized substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for fabricating semiconductor device, comprising:
    providing a substrate;
    forming a gate structure on the substrate;
    forming a spacer around the gate structure; and
    forming an epitaxial layer in the substrate adjacent to the spacer, wherein the step of forming the epitaxial layer comprises:
    forming a buffer layer in the substrate;
    forming a bulk layer on the buffer layer;

forming a linear gradient cap on the bulk layer, wherein the etching to deposition ratio of the linear gradient cap is greater than 50% and less than 100% and the etching to deposition (E/D) ratio is calculated by the following formula:

$$E/D \text{ Ratio} = \frac{\text{Etching gas flow}}{0.01*\text{Dose flow} + \text{Silicon source flow} + \text{Ge source flow}};$$

and forming a silicon cap on the linear gradient cap.

2. The method of claim 1, wherein the buffer layer, the bulk layer, and the linear gradient cap comprise silicon germanium.

3. The method of claim 1, wherein the etching to deposition ratio of the buffer layer is greater than 50% and less than 100%.

4. The method of claim 1, wherein the etching to deposition ratio of the bulk layer is greater than 50% and less than 100%.

5. The method of claim 1, wherein the etching to deposition ratio of at least one of the buffer layer, the bulk layer, the linear gradient cap, and the silicon cap is greater than 50% and less than 100%.

6. A method for fabricating semiconductor device, comprising:
   providing a substrate;
   forming a gate structure on the substrate;
   forming a spacer around the gate structure; and
   forming an epitaxial layer in the substrate adjacent to the spacer, wherein the step of forming the epitaxial layer comprises:
   forming a buffer layer in the substrate;
   forming a bulk layer on the buffer layer;
   forming a linear gradient cap on the bulk layer; and
   forming a silicon cap on the linear gradient cap, wherein the etching to deposition ratio of the silicon cap is greater than 50% and less than 100% and the etching to deposition (E/D) ratio is calculated by the following formula:

$$E/D \text{ Ratio} = \frac{\text{Etching gas flow}}{0.01*\text{Dose flow} + \text{Silicon source flow} + \text{Ge source flow}}.$$

7. The method of claim 6, wherein the buffer layer, the bulk layer, and the linear gradient cap comprise silicon germanium.

8. The method of claim 6, wherein the etching to deposition ratio of the buffer layer is greater than 50% and less than 100%.

9. The method of claim 6, wherein the etching to deposition ratio of the bulk layer is greater than 50% and less than 100%.

10. The method of claim 6, wherein the etching to deposition ratio of at least one of the buffer layer, the bulk layer, the linear gradient cap, and the silicon cap is greater than 50% and less than 100%.

* * * * *